US008836435B2

(12) United States Patent
Wang (10) Patent No.: US 8,836,435 B2
(45) Date of Patent: *Sep. 16, 2014

(54) OSCILLATOR WITH FREQUENCY DETERMINED BY RELATIVE MAGNITUDES OF CURRENT SOURCES

(71) Applicant: Tien-Yen Wang, Taipei (TW)

(72) Inventor: Tien-Yen Wang, Taipei (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/757,496

(22) Filed: Feb. 1, 2013

(65) Prior Publication Data

US 2013/0147564 A1    Jun. 13, 2013

Related U.S. Application Data

(63) Continuation of application No. 12/776,198, filed on May 7, 2010, now Pat. No. 8,378,753.

(51) Int. Cl.
 *H03K 3/03* (2006.01)
(52) U.S. Cl.
 CPC .................... *H03K 3/0315* (2013.01)
 USPC ........................................ 331/57; 331/177 R
(58) Field of Classification Search
 USPC ................... 331/57, 111, 143, 177 R
 See application file for complete search history.

(56) References Cited

U.S. PATENT DOCUMENTS

| 3,904,988 | A |   | 9/1975  | Hsiao              |        |
|-----------|---|---|---------|--------------------|--------|
| 5,180,995 | A |   | 1/1993  | Hayashi et al.     |        |
| 5,208,557 | A | * | 5/1993  | Kersh, III         | 331/57 |
| 5,331,295 | A |   | 7/1994  | Jelinek et al.     |        |
| 5,677,650 | A |   | 10/1997 | Kwasniewski et al. |        |
| 5,703,541 | A |   | 12/1997 | Nakashima          |        |
| 5,952,891 | A |   | 9/1999  | Boudry             |        |
| 7,382,203 | B2| * | 6/2008  | Kang               | 331/57 |
| 8,378,753 | B2| * | 2/2013  | Wang               | 331/57 |
| 2008/0111638 | A1| * | 5/2008 | Thaller         | 331/57 |

FOREIGN PATENT DOCUMENTS

CN   201001099 Y   1/2008
CN   201222719 Y   4/2009

OTHER PUBLICATIONS

I.M. Filanovsky and H. Baltes, "CMOS Schmitt Trigger Design," IEEE Transactions on Circuits and Systems—Fundamental Theory and Applications, vol. 41, No. 1, Jan. 1994, pp. 46-49.
Apr. 2, 2013 Office Action from related application CN 201010282290, 7 pp.

* cited by examiner

*Primary Examiner* — Ryan Johnson
(74) *Attorney, Agent, or Firm* — Kenta Suzue; Haynes Beffel & Wolfeld LLP (57) ABSTRACT

An oscillator circuit includes a circuit loop and multiple current sources. The circuit loop includes an output having the oscillating signal. The multiple current sources are turned on independently of a phase of the oscillating signal. The current sources control magnitudes of both charging current and discharging current at nodes of the circuit loop, including the output. Relative magnitudes of different current sources determine a frequency of the oscillating signal.

18 Claims, 10 Drawing Sheets

OSCILLATOR WITH FREQUENCY DETERMINED BY RELATIVE MAGNITUDES OF CURRENT SOURCES

RELATED APPLICATIONS

This application is a continuation of U.S. patent application Ser. No. 12/776,198, filed on 7 May 2010 entitled Oscillator With Frequency Determined by Relative Magnitudes of Current Sources. This application is incorporated herein by reference.

PARTIES TO A JOINT RESEARCH AGREEMENT

International Business Machines Corporation, a New York corporation, and Macronix International Corporation, Ltd., a Taiwan corporation are parties to a Joint Research Agreement.

BACKGROUND

1. Field of the Invention

This technology relates to an oscillator circuit, and in particular an oscillator circuit with a hysteresis circuit, such as a series of cross-coupled inverters, and separately in particular to the inclusion of multiple current sources to simplify the prediction of the oscillator frequency.

2. Description of Related Art

Current controlled ring oscillators, with a series of inverters powered by current sources, have a frequency which is difficult to predict, and have a slow transient. The slow transient and the difficulty of predicting the output frequency occur, because despite the inclusion of current sources, the charging and discharging current of an output node in the current controlled oscillator is not determined by a simple relationship to the size of the current sources. Instead, the current controlled ring oscillators has an output frequency which is a complicated and slow function of the sizes of the PMOS and NMOS transistors of the neighboring inverters, mobility, input voltage, etc.

SUMMARY

One aspect of the technology is an apparatus including an oscillator circuit generating an oscillating signal.

The oscillator circuit includes a circuit loop and multiple current sources. The circuit loop includes an output having the oscillating signal. The multiple current sources are turned on independently of a phase of the oscillating signal. The multiple current sources control magnitudes of both charging current and discharging current at nodes of the circuit loop, including the output. Relative magnitudes of different current sources in the multiple current sources determine a frequency of the oscillating signal.

In some embodiments, the circuit loop includes multiple series-connected hysteresis circuits. In some embodiment, the nodes connect neighboring hysteresis circuits. In one embodiment, the charging current of the nodes is determined by a current difference between a first current source of a following hysteresis circuit and a second current source of a preceding hysteresis circuit, such that the first current source draws a first current from a high voltage reference and the second current source sinks a second current to a low voltage reference. In another embodiment, the discharging current of the nodes is determined by a current difference between a first current source of a preceding hysteresis circuit and a second current source of a following hysteresis circuit, such that the first current source draws a first current from a high voltage reference and the second current source sinks a second current to a low voltage reference.

In some embodiments, the circuit loop includes multiple series-connected cross-coupled inverters. In some embodiments, the nodes connect neighboring cross-coupled inverters of the plurality of series-connected cross-coupled inverters. In one embodiment, the charging current of the nodes is determined by a current difference between a first current source of a following cross-coupled inverter and a second current source of a preceding cross-coupled inverter, such that the first current source draws a first current from a high voltage reference and the second current source sinks a second current to a low voltage reference. In another embodiment, the discharging current of the nodes is determined by a current difference between a first current source of a preceding cross-coupled inverter and a second current source of a following cross-coupled inverter, such that the first current source draws a first current from a high voltage reference and the second current source sinks a second current to a low voltage reference.

In some embodiments, the cross-coupled inverters include a first inverter and a second inverter, such that the first inverter has an output connected to an input of the second inverter, the second inverter has an output connected to an input of the first inverter, the input of the first inverter is responsive to a preceding signal from a preceding cross-coupled inverter, and the output of the first inverter sends a following signal to a following cross-coupled inverter.

In one embodiment, the relative magnitudes of the different current sources determine the frequency of the oscillating signal, in that the relative magnitudes of the different current sources include a current ratio of a first current source of the first inverter to a second current source of the second inverter, the first current source and the second current source drawing current from a high voltage reference.

In another embodiment, the relative magnitudes of the different current sources determine the frequency of the oscillating signal, in that the relative magnitudes of the different current sources include a current ratio of a first current source of the first inverter to a second current source of the second inverter, the first current source and the second current source sinking current to a low voltage reference.

In various embodiments, the oscillating signal is a triangle wave. In various embodiments, the oscillating signal is a sinusoidal wave.

Another aspect of the technology is a method, comprising the steps:

generating an oscillating signal from an output of a circuit loop, the frequency of the oscillating signal determined by relative magnitudes of different current sources in a plurality of current sources, the plurality of current sources turned on independently of a phase of the oscillating signal, the plurality of current sources controlling magnitudes of both charging current and discharging current at nodes of the circuit loop.

DETAILED DESCRIPTION

Figure 1:
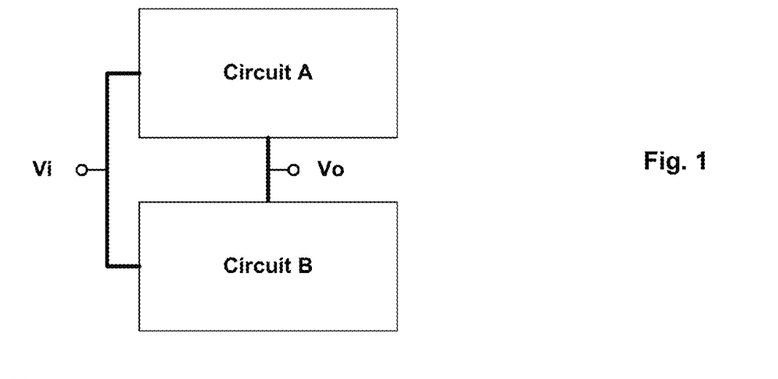
FIG. 1 is a simplified diagram of a hysteresis circuit with a pull up portion and a pull down portion.

FIG. 1 is a simplified diagram of a hysteresis circuit with a pull up portion and a pull down portion.

Figure 2:
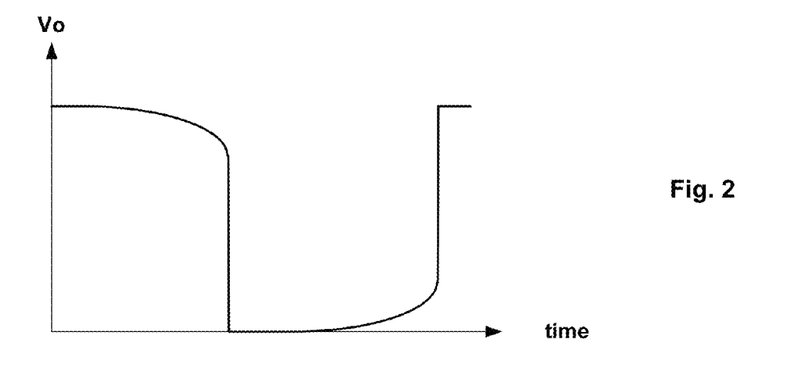
FIG. 2 is a time domain graph of the output voltage of a hysteresis circuit, showing that the present output is determined not just by the present input, but also by the past output.

Circuit A performs the pull up, and Circuit B performs the pull down. An example of Circuit A is a current source that sources current from a high voltage reference, and an example of Circuit B is a current source that sinks current to a low voltage reference FIG. 2 is a time domain graph of the output voltage of a hysteresis circuit, showing that the present output is determined not just by the present input, but also by the past output.

The transient is slow at the beginning, and then fast at the end.

Figure 3:
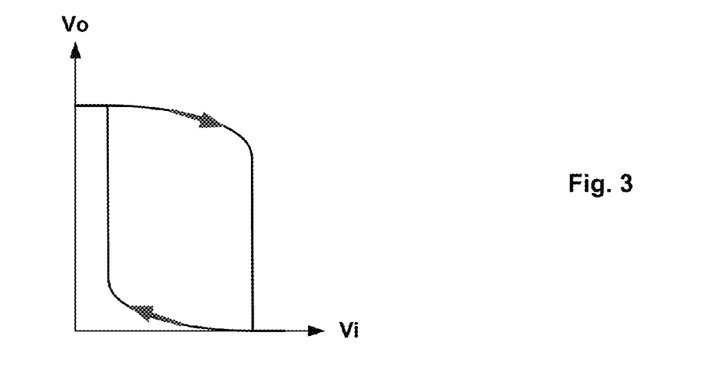
FIG. 3 is a graph of input voltage versus output voltage of a hysteresis circuit, also showing that the present output is determined not just by the present input, but also by the past output.

FIG. 3 is a graph of input voltage versus output voltage of a hysteresis circuit, also showing that the present output is determined not just by the present input, but also by the past output.

It appears to be the overlapped version of the rising and falling time domain curves, adjusted as functions of the input voltage.

Hysteresis is created by making the signal hard to transition or slower in one direction than the other direction.

Figure 4:
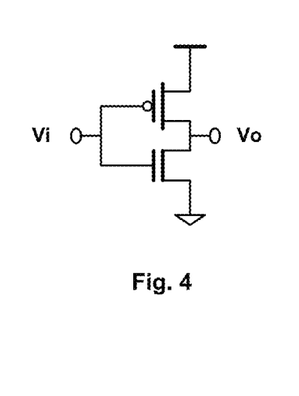
FIG. 4 is a circuit diagram of an inverter circuit which is not a hysteresis circuit.

FIG. 4 is a circuit diagram of an inverter circuit which is not a hysteresis circuit.

Figure 5:
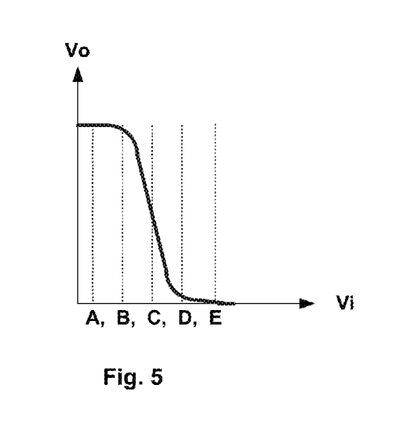
FIG. 5 is a graph of input voltage versus output voltage of the inverter circuit of FIG. 4, showing that the present output is determined by the present input without requiring the past output.

FIG. 5 is a graph of input voltage versus output voltage of the inverter circuit of FIG. 4, showing that the present output is determined by the present input without requiring the past output.

The transition from point A to point E occurs as follows:
At A: Vi=0.1, Vo=1
At B: Vi=0.3, Vo=1
At C: Vi=0.5, Vo=0.5
At D: Vi=0.7, Vo=0
At E: Vi=0.9, Vo=0

The opposite transition from point E to point A is exactly the same as listed above, but in the opposite order.

Figure 6:
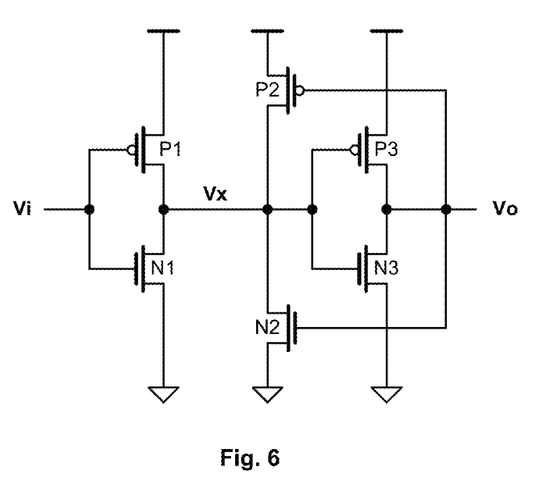
FIG. 6 is a circuit diagram of a hysteresis circuit, which includes a cross-coupled inverter preceded by an inverter circuit.

FIG. 6 is a circuit diagram of a hysteresis circuit, which includes a cross-coupled inverter preceded by an inverter circuit.

For simplicity, in some embodiments with a series of hysteresis circuits, the hysteresis circuit refers to the cross-coupled inverters, but without the preceding inverter circuit, there is no hysteresis.

Figure 7:
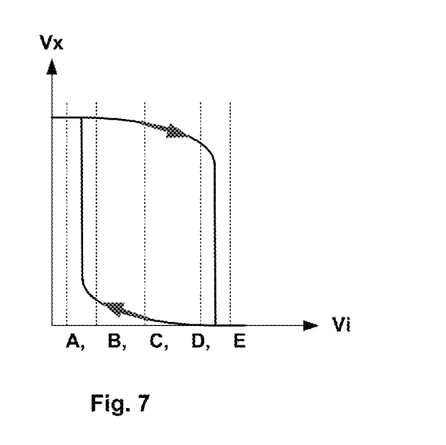
FIG. 7 is a graph of input voltage versus output voltage of the hysteresis circuit of FIG. 6, showing that the present output is determined not just by the present input, but also by the past output.

FIG. 7 is a graph of input voltage versus output voltage of the hysteresis circuit of FIG. 6, showing that the present output is determined not just by the present input, but also by the past output.

The transition from point A to point E occurs as follows:
At A: Vi=0.1, Vo=1
At B: Vi=0.3, Vo=1
At C: Vi=0.5, Vo=0.9
At D: Vi=0.7, Vo=0.7
At E: Vi=0.9, Vo=0

However, the opposite transition from point E to point A occurs as follows:
At E: Vi=0.9, Vo=0
At B: Vi=0.7, Vo=0
At C: Vi=0.5, Vo=0.1
At D: Vi=0.3, Vo=0.3
At E: Vi=0.1, Vo=1

Because the transition between point A and point E depends on the direction, there is hysteresis.

The hysteresis curve of FIG. 7 is explained in the context of FIG. 6.

At the beginning, say Vi=0, Vx=1, Vo=0
Vi=0.1
P1 stays "ON"; the same as P2 and P3.
N1 stays "OFF"; the same as N2 and N3, as if nothing happened.
Vi=0.1, Vx=1, Vo=0

Vi=0.3

P1, P2 and P3 are still "ON".

N1 is beginning to turn "ON" meaning a tiny amount of current is possibly going through. To simplify, say the current is too small, such that nothing changed.

Vi=0.3, Vx=1, Vo=0

Vi=0.5

P1 is turning off, but not yet, such that current from the power supply through P1 to Vx is reduced.

If only the single inverter P1 and N1 existed, then current IP1 would be equal to current IN1. But here P2 is still "ON", N2 is still "OFF. Therefore there are two currents IP1 and IP2 charging Vx; but only one current IN1 discharging Vx.

At this moment Vi=0.5, Vx=0.9, Vo=0. Something is happening on Vi and Vx, but nothing is affecting Vo.

Nothing is affecting Vo means Vx=0.9, such that Vo changes nothing.

Vi=0.7

The voltage Vi=0.7 turns off P1.

There will be one current IP2 charging Vx and one current IN1 discharging Vx. IP2>IN1 due to Vi=0.7. Vo is around 0.

So Vi=0.7, Vx=0.7, Vo=0 approximately.

Vi=0.9

N1 is really "ON" which makes Vx lower. Vx=0.3 first. Something is going on.

Vx=0.3 makes P3 turn "ON" which charges up Vo up to about 0.5.

Vo=0.5 makes IP2 smaller, then Vx will be lower than 0.3.

This feedback loop starts working. The feedback loop keeps increasing Vo up to 1, and decreasing Vx lower to 0.

Finally assume Vi=0.9, Vx=0, Vo=1.

Figure 8:
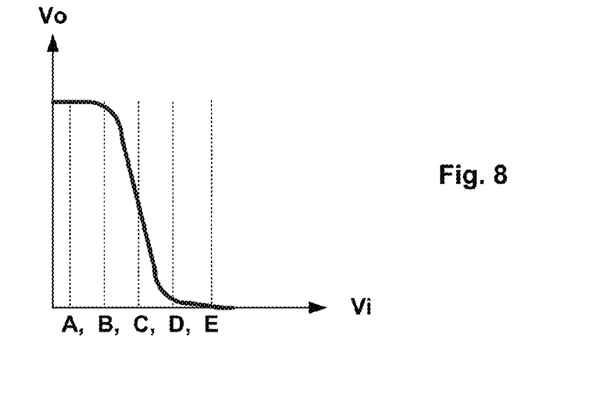
FIGS. 8-10 show example graphs of input voltage versus output voltage of an inverter circuit, showing that the transfer characteristic is predictably varied with the ratio of the strength of the component PMOS and NMOS transistors.
Figure 9:
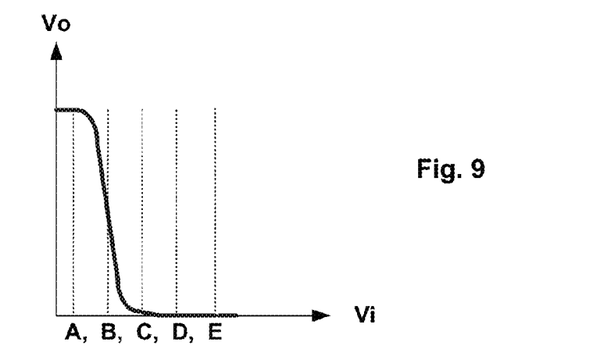
Figure 10:
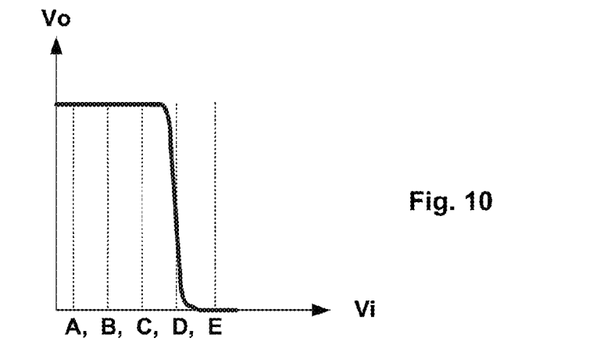

FIGS. 8-10 show example graphs of input voltage versus output voltage of an inverter circuit, showing that the transfer characteristic is predictably varied with the ratio of the strength of the component PMOS and NMOS transistors.

The ratio of the PMOS and NMOS controls the transient point.

In FIG. 8, the PMOS:NMOS ratio=1:1 (equal)
In FIG. 9, the PMOS:NMOS ratio=1:2 (NMOS stronger)
In FIG. 10, the PMOS:NMOS ratio=2:1 (PMOS stronger)

The transient point is controllable by adjusting the P and N wells.

Figure 11:
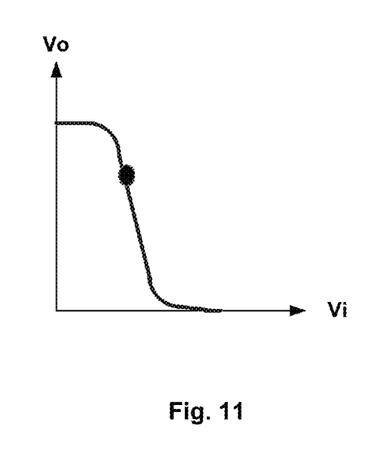
FIG. 11 is a graph of input voltage versus output voltage of an inverter circuit, with an example point along the transition region.

FIG. 11 is a graph of input voltage versus output voltage of an inverter circuit, with an example point along the transition region.

Figure 12:
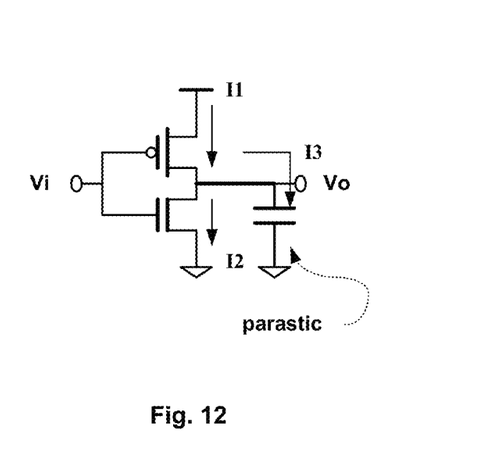
FIG. 12 is a circuit diagram of an inverter circuit operating at the example point along the transition region as shown in FIG. 11.

FIG. 12 is a circuit diagram of an inverter circuit operating at the example point along the transition region as shown in FIG. 11.

There are three currents I3=I1−I2. The three currents are predictable if they are practically simple to calculate.

Figure 13:
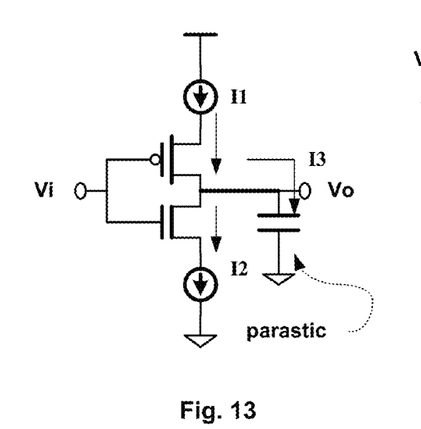
FIG. 13 is a circuit diagram of an inverter circuit with added current sources that attempt to simplify the prediction of the charging current and discharging current of the output node.

FIG. 13 is a circuit diagram of an inverter circuit with added current sources that attempt to simplify the prediction of the charging current and discharging current of the output node.

The added current sources attempt to control the rising and falling time of the inverter by setting the transient current to I1 for charging current and I2 for discharging current.

Figure 14:
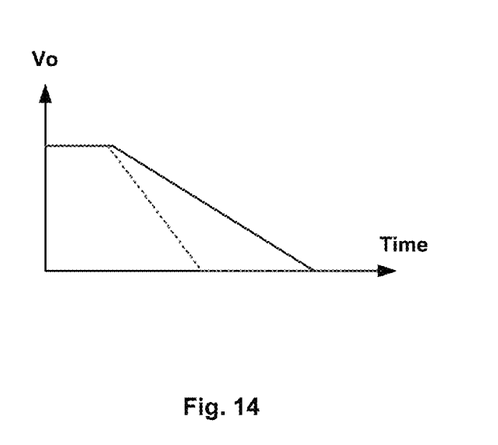
FIG. 14 is a time domain graph of the output voltage of an inverter circuit, with the added current sources as in FIG. 13, illustrating the difference between the expected fast transient discharge speed, and the actual slow transient discharge speed.

FIG. 14 is a time domain graph of the output voltage of an inverter circuit, with the added current sources as in FIG. 13, illustrating the difference between the expected fast transient discharge speed, and the actual slow transient discharge speed.

Unfortunately, the transient does not follow the dashed line, as would be the case if the added current sources dominated the transient current. Instead, despite the added current sources, the actual transient follows the slower solid line. The transient is slower than expected. The reason is that although I1 and I2 determine the transient speed on the PMOS and NMOS during charging and discharging Vo, the I3 current through the capacitance is too small.

For the purposes of predictability, although the equation is I3=I1−I2, the actual value of I3 is complicated to calculate, because the current I3 is related to size, Vi, mobility, etc.

Accordingly, there are two problems: slow transient speed, and lack of predictability. Various embodiments add current sources to address both problems.

Figure 15:
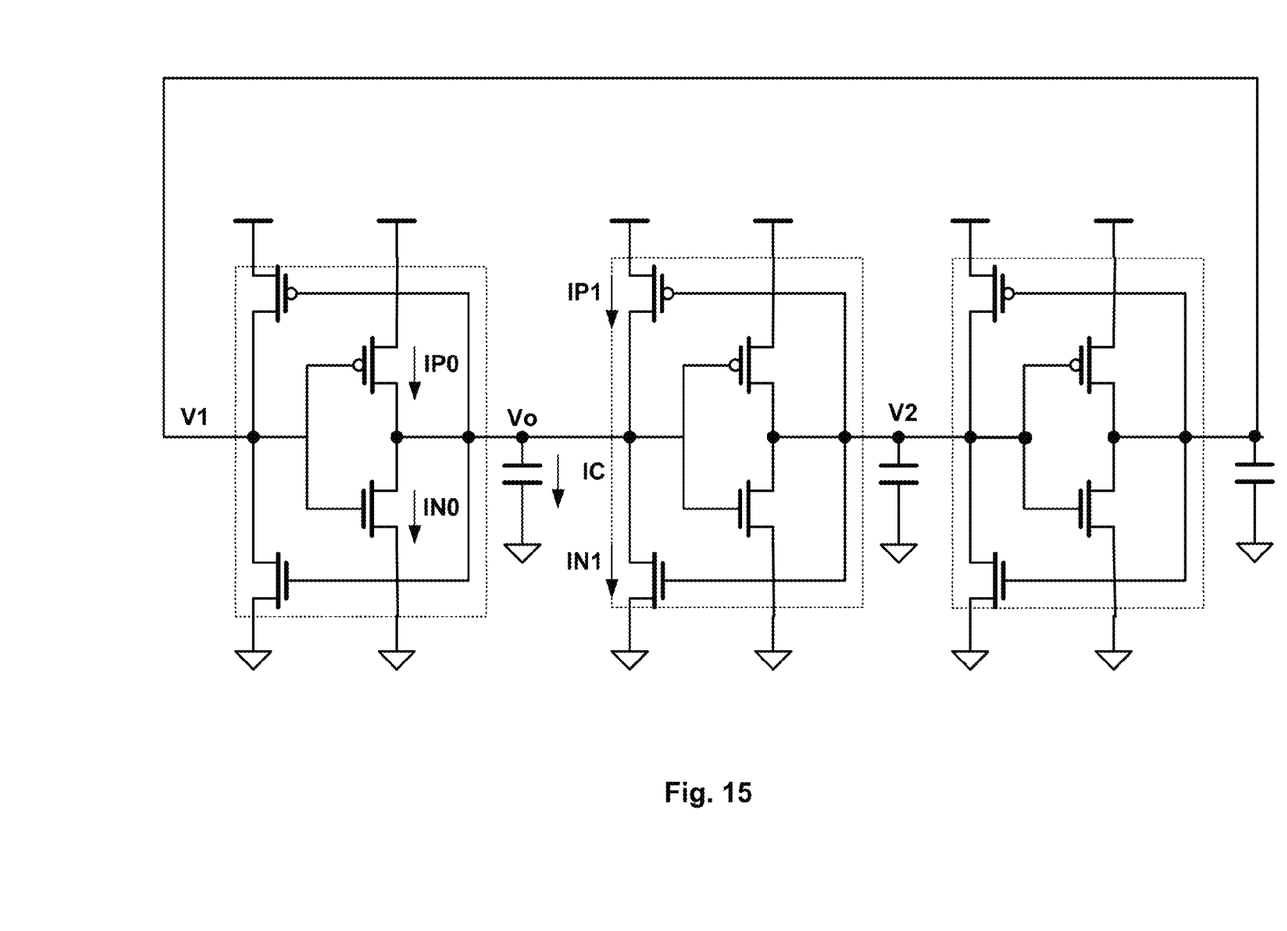
FIG. 15 is a circuit diagram of an oscillator circuit with a series of hysteresis circuits including cross-coupled inverters.

FIG. 15 is a circuit diagram of an oscillator circuit with a series of hysteresis circuits including cross-coupled inverters.

The circuit demonstrates current flow during the charging and discharging phases. Assume V1=1, Vo=0, V2=1 (V2=1 will make V1 go low like and inverter, and oscillation results.)

When Vo is at charging phase, ideally, IC is the charging current IC=IP1−IN0. But this is not the case.

When Vo is at discharging phase, ideally, IC is the discharging current=IN1−IP0. But this is not the case.

Figure 16:
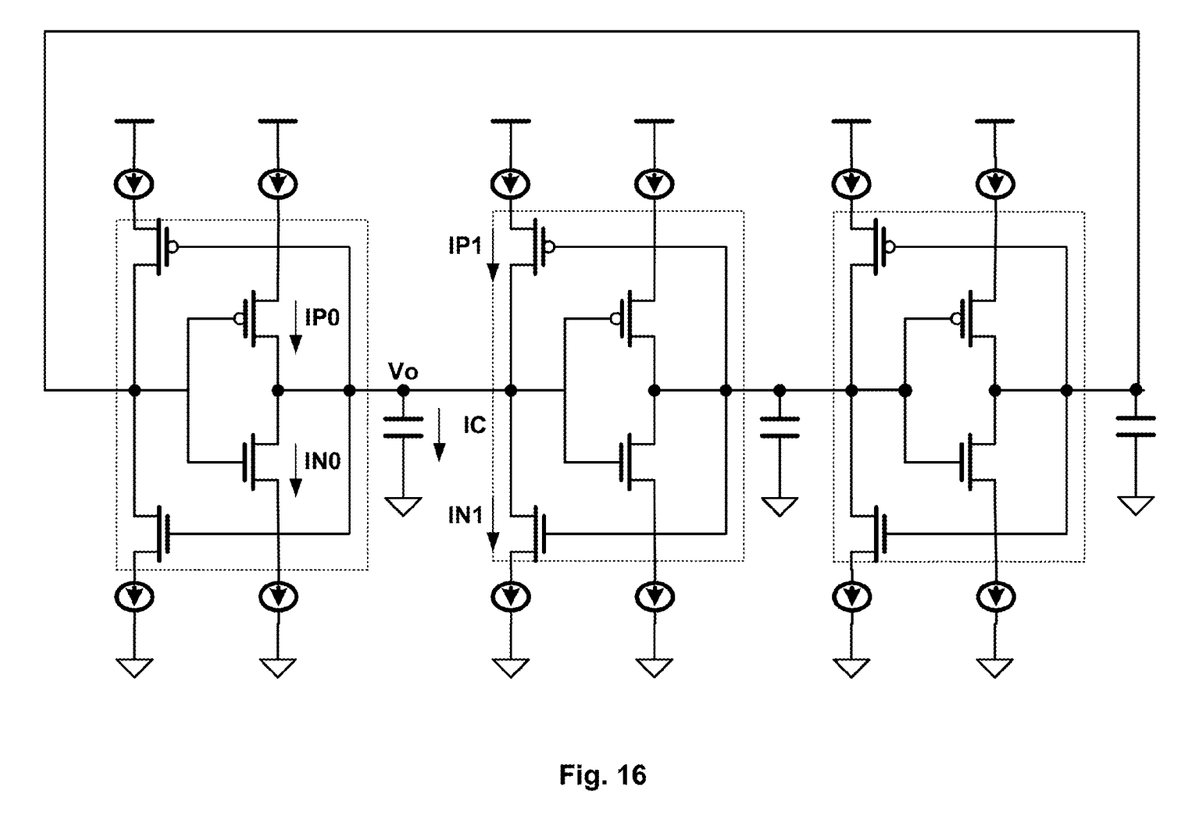
FIG. 16 is a circuit diagram of an oscillator circuit with a series of hysteresis circuits including cross-coupled inverters, and added current sources to simplify the prediction of the charging current and discharging current of the output node.

FIG. 16 is a circuit diagram of an oscillator circuit with a series of hysteresis circuits including cross-coupled inverters, and added current sources to simplify the prediction of the charging current and discharging current of the output node.

Figure 17:
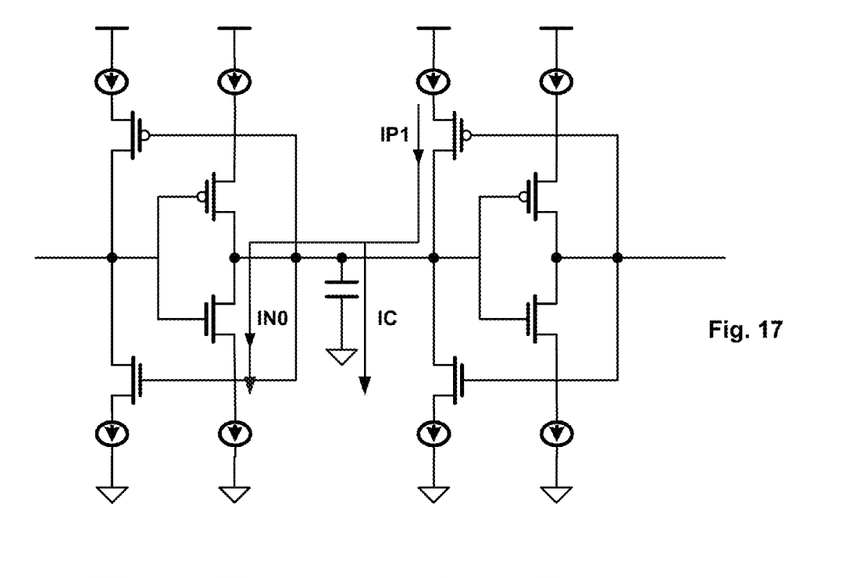
FIG. 17 is a circuit diagram of a portion of the oscillator circuit with a series of hysteresis circuits including cross-coupled inverters, and added current sources, as shown in FIG. 16, with a charging current path shown, including the two primary current sources that predict the charging current.
Figure 18:
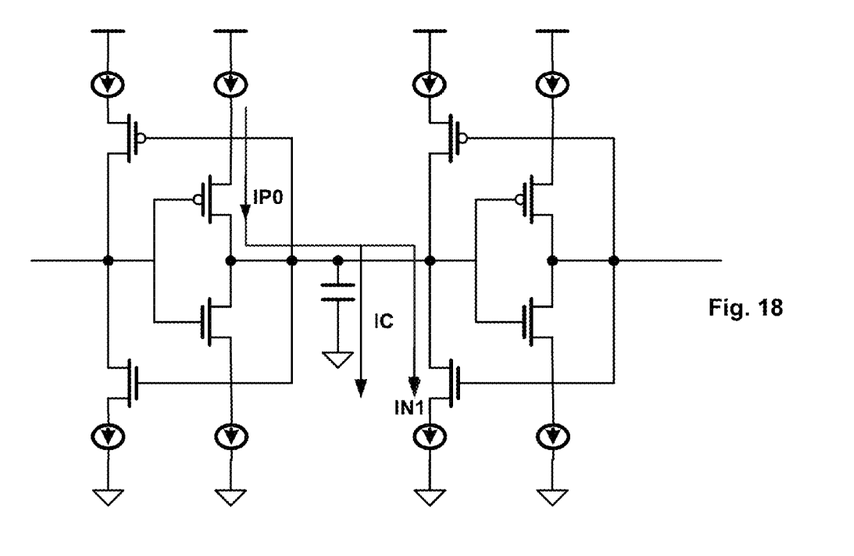
FIG. 18 is a circuit diagram of a portion of the oscillator circuit with a series of hysteresis circuits including cross-coupled inverters, and added current sources, as shown in FIG. 16, with a discharging current path shown, including the two primary current sources that predict the discharging current.

The current sources simplify prediction of the charging current and discharging current according to FIGS. 17 and 18.

The technology adds high controllability to the frequency of a ring oscillator without phase detection. A typical application is medium-high frequency (100 MHz~1 GHz) operation.

$I*T=C*V$, where I is current, T is period, C is capacitance, and V is peak voltage. There are 4 variables.

With a regulated V, C significantly larger than parasitic capacitance, then an accurate I determines 3 variables of the 4 variables, thereby making predictable the remaining 4th variable of T (or Frequency).

Accordingly, this technology accurately controls the current. Because C and V are also controlled, the current control also controls the frequency.

The following is an example of determining the current to achieve a 250 MHz (4 nS) oscillator signal.

$$I*T=C*V$$

V=2.5 V and regulated. Other voltages are possible.

C=250 fF, significant larger than parasitic capacitance.

The goal is T=2 ns, which represents a half cycle, corresponding to either the charging half cycle or the discharging half cycle.

According to the equation, the controlled current should be I=312.5 uA or about 300 uA. So peak current of IC should be 600 uA or higher, due to parasitic capacitance. This current comes from current reference system.

$$IC=IP1-IN0=600\text{ uA, or }IC=IN1-IP0=600\text{ uA}$$

In the following equations, I1 is for short for IP1 or IN1; I0 is for short for IP0 or IN0.

$$I1-I0=600\text{ uA}$$

I1=600 uA, I0=0 uA, I1:I0=infinite; means not physical.

I1=700 uA, I0=100 uA, I1:I0=7:1; too large a ratio is hard to current match, but saves some power I1=800 uA, I0=200 uA, I1:I0=4:1

I1=1.2 mA, I0=400 uA, I1:I0=3:1; current consumption is getting larger and not so much gain from ratio.

In the preceding example calculation, the ratio of the current sources corresponding to IP1 and IN0 is 4:1, and the ratio of the current sources corresponding to IN1 and IP0 is 4:1.

Similarly, the difference between the current sources corresponding to IP1 and IN0 is 600 uA, and the difference between the current sources corresponding to IN1 and IP0 is 600 uA.

In other embodiments, other current ratios are possible.

The values of IP0, IP1, IN0 and IN1 are controllable by a trimmed bias or a phase detector.

The ideal load capacitance CL varies with whether a phase detector is used. With a phase detector, load capacitance CL could be zero for saving power, and increase the oscillator frequency into the GHz range. Without a phase detector, load capacitance CL should be as large as possible, to avoid process variation, at the cost of more power consumption.

FIG. 17 is a circuit diagram of a portion of the oscillator circuit with a series of hysteresis circuits including cross-coupled inverters, and added current sources, as shown in FIG. 16, with a charging current path shown, including the two primary current sources that predict the charging current.

During the charging phase, the average charging current IC=K*(IP1−IN0)

K is a constant. K=½ for triangle current waveform.

FIG. 18 is a circuit diagram of a portion of the oscillator circuit with a series of hysteresis circuits including cross-coupled inverters, and added current sources, as shown in FIG. 16, with a discharging current path shown, including the two primary current sources that predict the discharging current.

During the discharge phase, the average discharging current IC=K*(IN1−IP0)

Again, K is a constant. K=½ for triangle current waveform.

At a lower frequency range, where the output waveform is triangular, $$T=2*\{[CL*(Vd-Vs)]/[0.5*(x-y)]\}$$

(x−y) represents a relative magnitude of the current sources, such as (800 uA−200 uA).

(Vd−Vs) represents a difference between the high voltage reference and the low voltage reference. The current sources source current from the high voltage reference Vd and sink current to the low voltage reference Vs.

Frequency=1/T (units in Hertz)

FIGS. 19-25 are time domain graphs of different nodes of the oscillator circuit with a series of hysteresis circuits including cross-coupled inverters, and added current sources, as shown in FIG. 16.

FIGS. 19-25 divide a full clock period into 4 smaller time periods, labeled T1, T2, T3, and T4.

In both T1 and T2, the output node OUT has a discharging current of IN1-IP0, and IP1 and IN0 are almost off. Because IP1 and IN0 are almost off, their contribution can be practically ignored for predicting the oscillator frequency.

In both T3 and T4, the output node OUT has a charging current of IP1-IN0, and IP0 and IN1 are almost off. Because IP0 and IN1 are almost off, their contribution can be practically ignored for predicting the oscillator frequency.

Figures 19, 20, 21, 22:
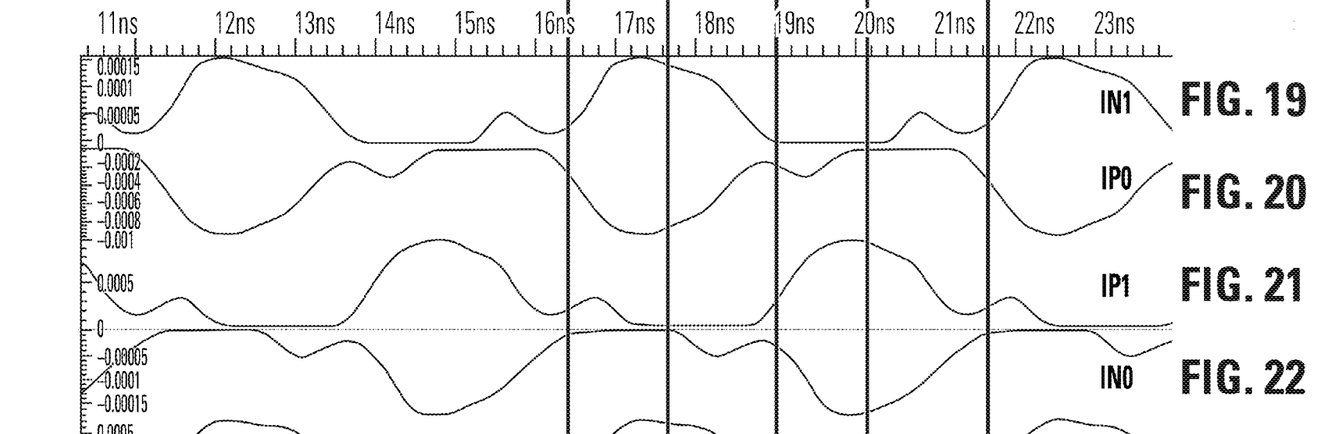
FIGS. 19-25 are time domain graphs of different nodes of the oscillator circuit with a series of hysteresis circuits including cross-coupled inverters, and added current sources, as shown in FIG. 16.

FIG. 19 is IN1, the current flowing through the NMOS of an inverter. The NMOS is connected to the output node, and the inverter belongs to a following cross-coupled inverter of neighboring cross-coupled inverters.

FIG. 20 is IP0, the current flowing through the PMOS of an inverter. The PMOS is connected to the output node, and the inverter belongs to a preceding cross-coupled inverter of neighboring cross-coupled inverters.

FIG. 21 is IP1, the current flowing through the PMOS of an inverter. The PMOS is connected to the output node, and the inverter belongs to a following cross-coupled inverter of neighboring cross-coupled inverters.

FIG. 22 is IN0, the current flowing through the NMOS of an inverter. The NMOS is connected to the output node, and the inverter belongs to a preceding cross-coupled inverter of neighboring cross-coupled inverters.

Figures 23, 24, 25:
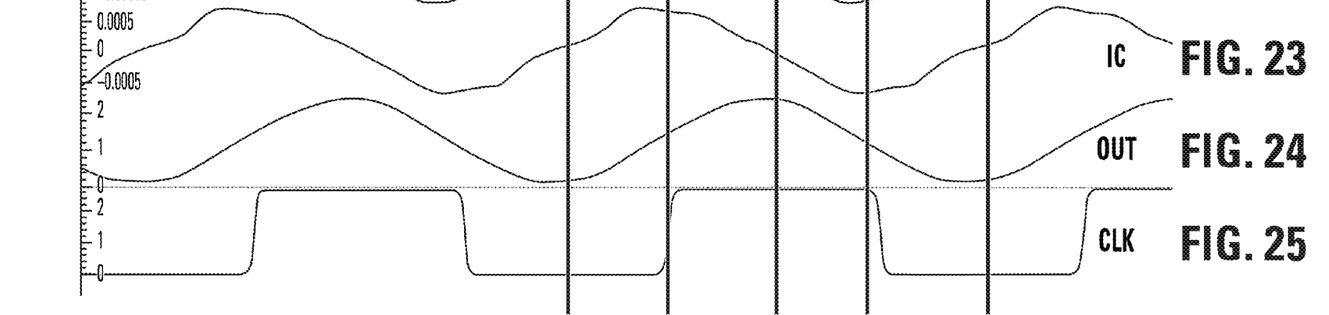

FIG. 23 is IC, the current flowing through the capacitance of the output node. The magnitude of the IC current determines the speed of charging or discharging the output node.

FIG. 24 is OUT, the output voltage of the output node. Accordingly, the rising part of the output voltage OUT corresponds to positive IC current, and the falling part of the output voltage OUT corresponds to negative IC current.

FIG. 25 is CLK, the clock voltage following a buffer of the output node. The buffer helps the oscillator output look more digital. The number of buffers depends on the number of blocks to be driven. Buffers make the transient faster to get a square-like waveform. An inverter not only separates signals, but also provides drivability.

Figure 26:
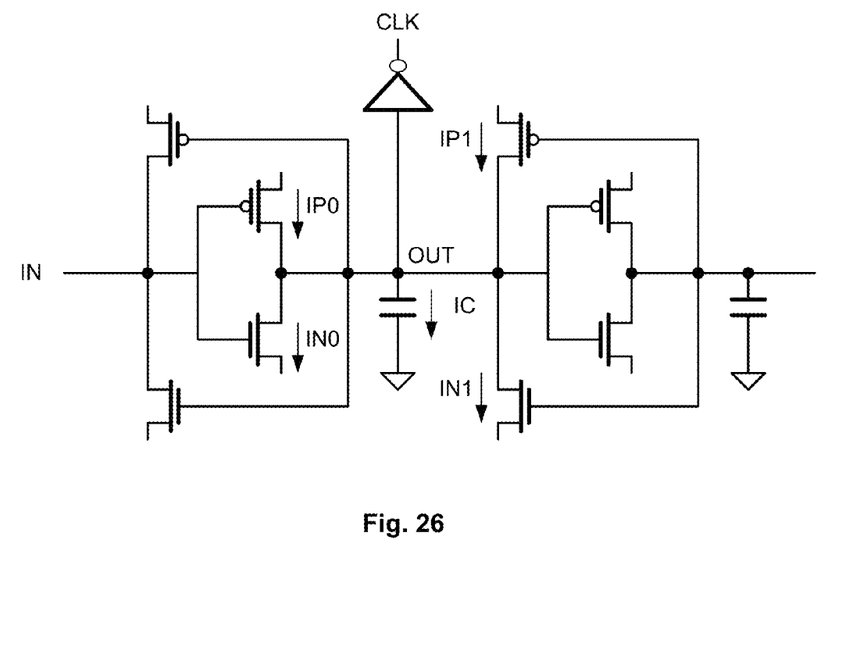
FIG. 26 is a circuit diagram of a portion of the oscillator circuit with a series of hysteresis circuits including cross-coupled inverters, and added current sources, as shown in FIG. 16, acting as a key to indicate the graphed nodes of FIGS. 19-25.

FIG. 26 is a circuit diagram of a portion of the oscillator circuit with a series of hysteresis circuits including cross-coupled inverters, and added current sources, as shown in FIG. 16, acting as a key to indicate the graphed nodes of FIGS. 19-25.

Figure 27:
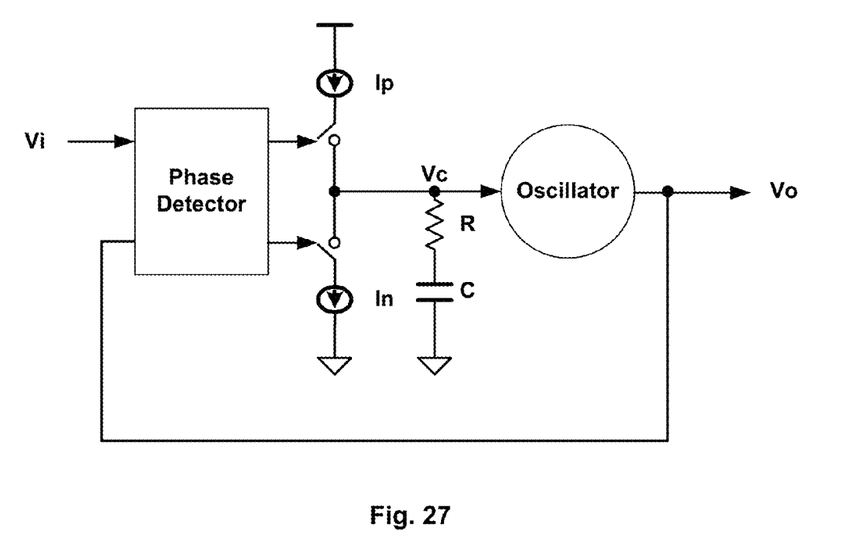
FIG. 27 is a circuit diagram of a voltage controlled oscillator, including the oscillator circuit with a series of hysteresis circuits.

FIG. 27 is a circuit diagram of a voltage controlled oscillator, including the oscillator circuit with a series of hysteresis circuits.

An improved voltage controllable oscillator includes the improved oscillator technology herein. The voltage controllable oscillator includes a phase detector and a charge pump circuit. The charge pump circuit includes 2 current sources Ip, resistor R, and capacitor C.

Other embodiments include CCO (current controllable oscillator) and RCO (resistor controllable oscillator)

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. An apparatus, comprising:
an oscillator circuit generating an oscillating signal, comprising:
a circuit loop including an output having the oscillating signal; and
a plurality of current sources turned on independently of a phase of the oscillating signal, the plurality of current sources controlling magnitudes of both charging current and discharging current at nodes of the circuit loop, the nodes including the output, the plurality of current sources including different current sources, wherein relative magnitudes of the different current sources controlling current flow through different cross-coupled circuits of a plurality of series-connected cross-coupled circuits in the circuit loop determine a frequency of the oscillating signal.

2. The apparatus of claim 1, wherein the circuit loop includes a plurality of series-connected cross-coupled circuits, and the nodes connect neighboring cross-coupled circuits of the plurality of series-connected cross-coupled circuits, and the charging current of the nodes is determined by a current difference between a first current source of a following cross-coupled circuit and a second current source of a preceding cross-coupled circuit, the first current source drawing a first current from a high voltage reference and the second current source sinking a second current to a low voltage reference.

3. The apparatus of claim 1, wherein the circuit loop includes a plurality of series-connected cross-coupled circuits, and the nodes connect neighboring cross-coupled circuits of the plurality of series-connected cross-coupled circuits, and the discharging current of the nodes is determined by a current difference between a first current source of a preceding cross-coupled circuit and a second current source of a following cross-coupled circuit, the first current source drawing a first current from a high voltage reference and the second current source sinking a second current to a low voltage reference.

4. The apparatus of claim 1, wherein the circuit loop includes a plurality of series-connected cross-coupled inverters, and the nodes connect neighboring cross-coupled inverters of the plurality of series-connected cross-coupled inverters, and the charging current of the nodes is determined by a current difference between a first current source of a following cross-coupled inverter and a second current source of a preceding cross-coupled inverter, the first current source drawing a first current from a high voltage reference and the second current source sinking a second current to a low voltage reference.

5. The apparatus of claim 1, wherein the circuit loop includes a plurality of series-connected cross-coupled inverters, and the nodes connect neighboring cross-coupled inverters of the plurality of series-connected cross-coupled inverters, and the discharging current of the nodes is determined by a current difference between a first current source of a preceding cross-coupled inverter and a second current source of a following cross-coupled inverter, the first current source drawing a first current from a high voltage reference and the second current source sinking a second current to a low voltage reference.

6. The apparatus of claim 1, wherein the circuit loop includes a plurality of series-connected cross-coupled inverters, and the nodes connect neighboring cross-coupled inverters of the plurality of series-connected cross-coupled inverters, and the cross-coupled inverters include a first inverter and a second inverter, such that the first inverter has an output connected to an input of the second inverter, the second inverter has an output connected to an input of the first inverter, the input of the first inverter is responsive to a preceding signal from a preceding cross-coupled inverter, and the output of the first inverter sends a following signal to a following cross-coupled inverter, wherein the relative magnitudes of the different current sources in the plurality of current sources determine the frequency of the oscillating signal, in that the relative magnitudes of the different current sources include a current ratio of a first current source of the first inverter to a second current source of the second inverter, the first current source and the second current source drawing current from a high voltage reference.

7. The apparatus of claim 1, wherein the circuit loop includes a plurality of series-connected cross-coupled inverters, and the nodes connect neighboring cross-coupled inverters of the plurality of series-connected cross-coupled inverters, and the cross-coupled inverters include a first inverter and a second inverter, such that the first inverter has an output connected to an input of the second inverter, the second inverter has an output connected to an input of the first inverter, the input of the first inverter is responsive to a preceding signal from a preceding cross-coupled inverter, and the output of the first inverter sends a following signal to a following cross-coupled inverter, wherein the relative magnitudes of the different current sources in the plurality of current sources determine the frequency of the oscillating signal, in that the relative magnitudes of the different current sources include a current ratio of a first current source of the first inverter to a second current source of the second inverter, the first current source and the second current source sinking current to a low voltage reference.

8. The apparatus of claim 1, wherein the oscillating signal is a triangle wave.

9. The apparatus of claim 1, wherein the oscillating signal is a sinusoidal wave.

10. A method, comprising:
generating an oscillating signal from an output of a circuit loop, the frequency of the oscillating signal determined by relative magnitudes of different current sources controlling current flow through different cross-coupled circuits of a plurality of series-connected cross-coupled circuits in the circuit loop, the different current sources in a plurality of current sources turned on independently of a phase of the oscillating signal, the plurality of current sources controlling magnitudes of both charging current and discharging current at nodes of the circuit loop.

11. The method of claim 10, wherein the circuit loop includes a plurality of series-connected cross-coupled circuits, and the nodes connect neighboring cross-coupled circuits of the plurality of series-connected cross-coupled circuits, and the charging current of the nodes is determined by a current difference between a first current source of a following cross-coupled circuit and a second current source of a preceding cross-coupled circuit, the first current source drawing a first current from a high voltage reference and the second current source sinking a second current to a low voltage reference.

12. The method of claim 10, wherein the circuit loop includes a plurality of series-connected cross-coupled circuits, and the nodes connect neighboring cross-coupled circuits of the plurality of series-connected cross-coupled circuits, and the discharging current of the nodes is determined by a current difference between a first current source of a preceding cross-coupled circuit and a second current source of a following cross-coupled circuit, the first current source drawing a first current from a high voltage reference and the second current source sinking a second current to a low voltage reference.

13. The method of claim 10, wherein the circuit loop includes a plurality of series-connected cross-coupled inverters, and the nodes connect neighboring cross-coupled inverters of the plurality of series-connected cross-coupled inverters, and the charging current of the nodes is determined by a current difference between a first current source of a following cross-coupled inverter and a second current source of a preceding cross-coupled inverter, the first current source drawing a first current from a high voltage reference and the second current source sinking a second current to a low voltage reference.

14. The method of claim 10, wherein the circuit loop includes a plurality of series-connected cross-coupled inverters, and the nodes connect neighboring cross-coupled inverters of the plurality of series-connected cross-coupled inverters, and the discharging current of the nodes is determined by a current difference between a first current source of a preceding cross-coupled inverter and a second current source of a following cross-coupled inverter, the first current source drawing a first current from a high voltage reference and the second current source sinking a second current to a low voltage reference.

15. The method of claim 10, wherein the circuit loop includes a plurality of series-connected cross-coupled inverters, and the nodes connect neighboring cross-coupled inverters of the plurality of series-connected cross-coupled inverters, and the cross-coupled inverters include a first inverter and a second inverter, such that the first inverter has an output connected to an input of the second inverter, the second inverter has an output connected to an input of the first inverter, the input of the first inverter is responsive to a preceding signal from a preceding cross-coupled inverter, and the output of the first inverter sends a following signal to a following cross-coupled inverter, wherein the relative magnitudes of the different current sources in the plurality of current sources determine the frequency of the oscillating signal, in that the relative magnitudes of the different current sources include a current ratio of a first current source of the first inverter to a second current source of the second inverter, the first current source and the second current source drawing current from a high voltage reference.

16. The method of claim 10, wherein the circuit loop includes a plurality of series-connected cross-coupled inverters, and the nodes connect neighboring cross-coupled inverters of the plurality of series-connected cross-coupled inverters, and the cross-coupled inverters include a first inverter and a second inverter, such that the first inverter has an output connected to an input of the second inverter, the second inverter has an output connected to an input of the first inverter, the input of the first inverter is responsive to a preceding signal from a preceding cross-coupled inverter, and the output of the first inverter sends a following signal to a following cross-coupled inverter, wherein the relative magnitudes of the different current sources in the plurality of current sources determine the frequency of the oscillating signal, in that the relative magnitudes of the different current sources include a current ratio of a first current source of the first inverter to a second current source of the second inverter, the first current source and the second current source sinking current to a low voltage reference.

17. The method of claim 10, wherein the oscillating signal is a triangle wave.

18. The method of claim 10, wherein the oscillating signal is a sinusoidal wave.

* * * * *